(12) United States Patent
Sato et al.

(10) Patent No.: US 7,728,268 B2
(45) Date of Patent: Jun. 1, 2010

(54) SOLID-STATE IMAGING DEVICE AND ELECTRONIC DEVICE

(75) Inventors: Kimihiko Sato, Kanagawa (JP); Tetsuya Iizuka, Kanagawa (JP)

(73) Assignee: Sony Corporation, Tokyo (JP)

( * ) Notice: Subject to any disclaimer, the term of this patent is extended or adjusted under 35 U.S.C. 154(b) by 226 days.

(21) Appl. No.: 11/877,318

(22) Filed: Oct. 23, 2007

(65) Prior Publication Data

US 2008/0099867 A1    May 1, 2008

(30) Foreign Application Priority Data

Oct. 25, 2006 (JP) .............................. 2006-290383

(51) Int. Cl.
  *H01L 27/00* (2006.01)
  *H01L 31/00* (2006.01)
  *H01J 40/14* (2006.01)
  *H04N 3/14* (2006.01)
  *G02F 1/295* (2006.01)

(52) U.S. Cl. ............... 250/208.1; 250/214 R; 257/59; 348/308; 385/4

(58) Field of Classification Search ............... 250/208.1, 250/214.1, 214 R, 226, 214 A, 214 LA, 216; 257/59, 72, 231, 443, 210, 211, 294, 435, 257/508, 730; 348/272, 308, 309, 310, 315, 348/281, 293, 302; 385/4–8, 11–16

See application file for complete search history.

(56) References Cited

U.S. PATENT DOCUMENTS

| 7,394,137 | B2 * | 7/2008 | Hayashi et al. | ............. 257/409 |
| 2004/0016935 | A1 | 1/2004 | Kubota et al. | |
| 2004/0100570 | A1 * | 5/2004 | Shizukuishi | ................. 348/272 |
| 2005/0181287 | A1 * | 8/2005 | Yamada | ......................... 430/7 |

FOREIGN PATENT DOCUMENTS

| JP | 2002-100798 | 4/2002 |
| JP | 2003-282850 | 10/2003 |
| JP | 2005-277404 | 10/2005 |
| JP | 2006-210582 | 8/2006 |

OTHER PUBLICATIONS

Japanese Office Action issued on Mar. 3, 2009 corresponding to JP Patent Application No. 2006-290383.

* cited by examiner

*Primary Examiner*—Georgia Y Epps
*Assistant Examiner*—Don Williams
(74) *Attorney, Agent, or Firm*—Sonnenschein Nath & Rosenthal LLP (57) ABSTRACT

A solid-state imaging device including a number of pixels, each of which having a photoelectric converting portion, and which are arranged one-dimensionally or in a two-dimensional matrix. The solid-state imaging device includes a peripheral wiring portion with a multilayer structure provided around at least part of the photoelectric converting portion in each of the number of pixels and a light-shielding interlayer connecting material connecting layers of the multilayer structure to each other at least part of the peripheral wiring portion. The light-shielding interlayer connecting material is capable of reflecting or absorbing visible light.

10 Claims, 7 Drawing Sheets

SOLID-STATE IMAGING DEVICE AND ELECTRONIC DEVICE

CROSS REFERENCES TO RELATED APPLICATIONS

The present invention contains subject matter related to Japanese Patent Application JP 2006-290383 filed in the Japanese Patent Office on Oct. 25, 2006, the entire contents of which being incorporated herein by reference.

BACKGROUND OF THE INVENTION

1. Field of the Invention

The present invention relates to a solid-state imaging device and an electronic device including the solid-state imaging device.

2. Description of the Related Art

Solid-state imaging devices are widely used as image input devices for various types of electronic devices such as digital still cameras, digital single-lens reflex cameras, digital video cameras, and portable terminals.

A solid-state imaging device includes a number of pixels (picture cells) arranged in a two-dimensional matrix such as an array. The pixel has at least a photodiode as a photodetecting portion to convert light into electrons and a transfer portion. The transfer portion in a CCD (charge-coupled device) solid-state imaging device has a vertical transfer portion and a horizontal transfer portion formed by CCD elements, for example. The transfer portion in a CMOS (Complementary Metal-Oxide-Semiconductor) solid-state imaging device (CMOS image sensor) has an amplifier circuit portion to convert electrons from the photodiode into voltage and amplify and transfer the voltage, for example.

A number of pixels are adjacent to each other in the solid-state imaging device. Therefore, part of light incident on a photodiode of a pixel may be mixed in an adjacent pixel (crosstalk).

Crosstalk occurs due to modulation (such as reflection, diffraction, or scattering) of part of incident light. Such occurrence of crosstalk between pixels affects an output, that is, resulting image data. Specifically, bright spots may be generated in an image that should be black, for example, so that image data intended may not be accurately obtained.

Such occurrence of crosstalk will be described referring to, as an example, a case where the aforementioned modulation is reflection.

Figure 1:
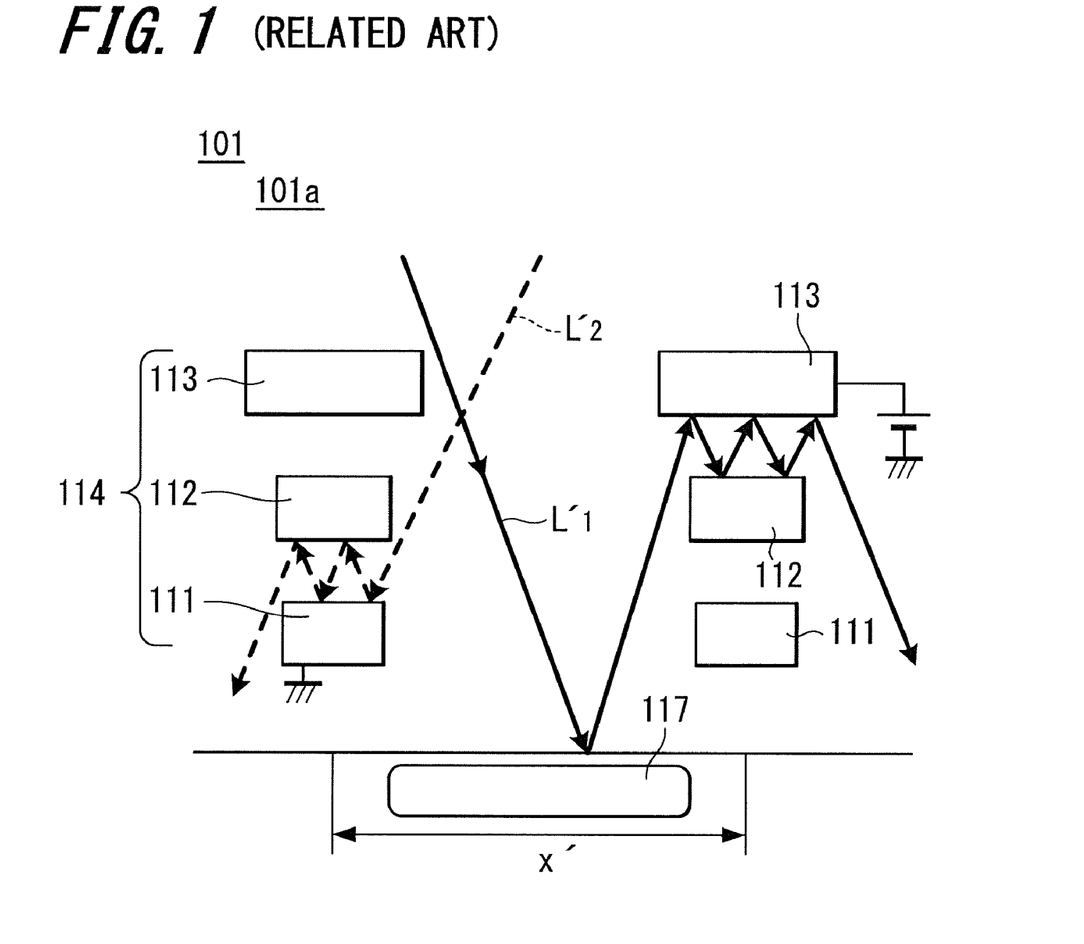
FIG. 1 is a view describing a peripheral wiring portion in a pixel of a solid-state imaging device of the related art.

FIG. 1 shows a pixel configuration of a solid-state imaging device of the related art.

In a solid-state imaging device 101 of the related art, part of light ($L_1$' in the figure) incident on a photodiode 117 of a pixel 101a (cell size x') is reflected by a surface of a semiconductor substrate including the photodiode 117 and is leaked to an adjacent pixel. Therefore, it is difficult to prevent crosstalk from occurring between pixels in every solid-state imaging device having a photodiode, including any of CCD/CMOS solid-state imaging devices.

There has been proposed a method of providing an antireflective film on a substrate surface as a measure for the problem. However, this method is known to have other problems such as a change in spectral characteristics.

Further, incident light may be reflected by a member around the photodiode before reaching the photodiode ($L_2$' in the figure). For example, the solid-state imaging device 101 has a peripheral wiring portion 114 with a multilayer structure provided around the photodiode. Accordingly, incident light is repeatedly reflected by wiring layers of the peripheral wiring portion 114 (a first wiring layer 111, a second wiring layer 112, and a third wiring layer 113 shown in FIG. 1) and is leaked to and mixed in an adjacent pixel in a route different from that of the light ($L_1$') reflected by the substrate surface.

As a method of preventing such crosstalk due to repeated reflection, there has been proposed a method of separately providing a light-shielding wall between pixels. However, this method is complicated because it may be necessary to carry out a separate process of forming the wall. Further, if such a wall is provided, pixel area increases, thereby preventing a reduction in size of the device (refer to Japanese Unexamined Patent Application Publication No. 2005-277404).

SUMMARY OF THE INVENTION

The present invention addresses the above-identified problems and provides a solid-state imaging device in which crosstalk between pixels may be suppressed with a more simplified configuration and an electronic device including the solid-state imaging device.

According to an embodiment of the present invention, there is provided a solid-state imaging device having a number of pixels each having a photoelectric converting portion and arranged one-dimensionally or in a two-dimensional matrix. A peripheral wiring portion with a multilayer structure is provided around at least part of the photoelectric converting portion in each of the number of pixels. A light-shielding interlayer connecting material to connect layers of the multilayer structure to each other is provided to at least part of the peripheral wiring portion.

According to an embodiment of the present invention, there is provided an electronic device including a solid-state imaging device. The solid-state imaging device has a number of pixels each having a photoelectric converting portion and arranged one-dimensionally or in a two-dimensional matrix. A peripheral wiring portion with a multilayer structure is provided around at least part of the photoelectric converting portion in each of the number of pixels. A light-shielding interlayer connecting material to connect layers of the multilayer structure to each other is provided to at least part of the peripheral wiring portion.

A solid-state imaging device according to an embodiment of the present invention includes a light-shielding interlayer connecting material to connect layers of a multilayer structure to each other provided to at least part of a peripheral wiring portion. Therefore, the solid-state imaging device may improve image quality with a reduction in crosstalk.

An electronic device according to an embodiment of the present invention includes a solid-state imaging device that may improve image quality with a reduction in crosstalk. Therefore, the electronic device may use high-quality image data.

DESCRIPTION OF THE PREFERRED EMBODIMENTS

An embodiment of the present invention will be described below with reference to FIGS. 2 through 8.

A CMOS solid-state imaging device (CMOS image sensor) typically has a structure less advantageous than a CCD solid-state imaging device in terms of generation and influence of crosstalk.

A CMOS image sensor has a plurality of transistors in a pixel. Therefore, it may be necessary to provide wirings for selecting a transistor in the CMOS image sensor, as well as the transistors. Accordingly, a CMOS image sensor has an area occupied by wirings in a pixel larger than that in a CCD solid-state imaging device. That is, an opening area of a photodiode is restricted by an area occupied by the wirings and transistors. In recent years, such restriction is increasing because pixels are reduced in size.

When the number of wirings in a pixel increases in this manner, the wirings are provided in the same layer (at an equal depth and an equal height) and thus placed extremely close to each other. Therefore, there is an increased risk of bringing the wirings into contact with each other. For this reason, wirings of a CMOS image sensor are formed as a peripheral wiring layer with a multilayer structure to more surely avoid such contact.

Although contact of wirings with each other is suppressed in such a multilayer structure, there is a large height (depth) between a surface of a semiconductor substrate having a photodiode and an upper surface of the multilayer structure. Therefore, there may be a long distance for light incident from outside to reach the photodiode, and the number of and space for the wirings also increase. Accordingly, the aforementioned modulation (reflection, diffraction, and scattering on the substrate surface and in the wirings) occurs before the incident light reaches the substrate.

According to an embodiment of the present invention, a CMOS solid-state imaging device is provided as an example of a solid-state imaging device in which above-described modulation and others are particularly improved.

Figure 2:
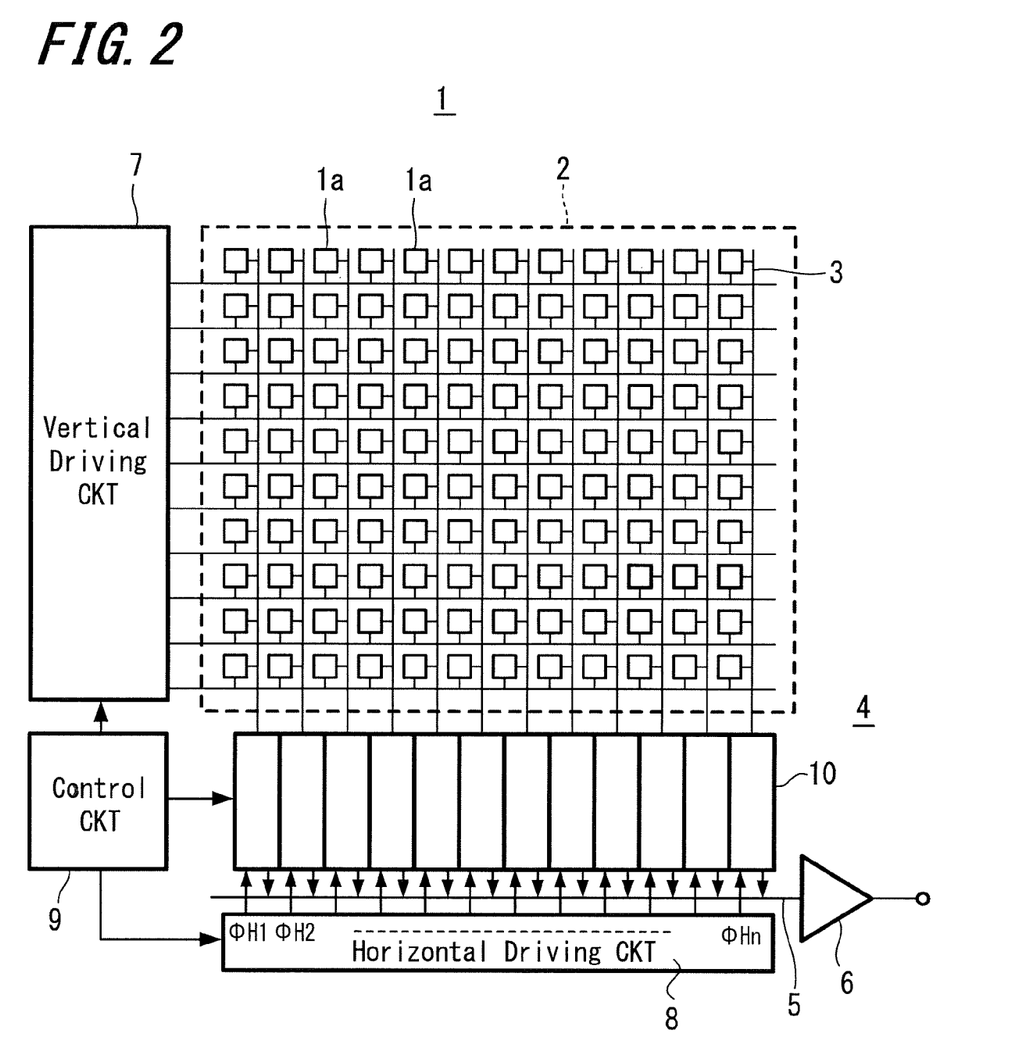
FIG. 2 is a schematic view showing a configuration of an example of a solid-state imaging device according to an embodiment of the present invention.

FIG. 2 shows a MOS amplifying solid-state imaging device having an analog/digital converter for each column according to an embodiment of the present invention.

A solid-state imaging device typically includes an imaging region having a number of pixels each having a photoelectric converting portion, that is, a photodiode and regularly arranged in a two-dimensional matrix with vertical columns and horizontal rows, for example; a transfer portion having a vertical driving portion and a horizontal driving portion; and an output portion. Specifically, as shown in FIG. 2, a solid-state imaging device 1 includes an imaging region 2 having a plurality of pixels 1a arranged in a two-dimensional matrix; a vertical signal line 3; a column portion 4; an output circuit 6 connected to a horizontal signal line 5; a vertical driving circuit 7; a horizontal driving circuit 8; and a control circuit 9.

The control circuit 9 receives an input clock and data to give instructions about an operation mode or the like from outside the MOS image sensor and supplies a clock and a pulse which may be necessary for operation of each of the following portions according to the input clock and the data.

The vertical driving circuit 7 selects a pixel row and supplies a necessary pulse to the pixels of the row through a control wiring in a transverse direction (not shown).

The column portion 4 has column signal processing circuits 10 arranged corresponding to the columns. The column signal processing circuit 10 receives signals from the pixels in one column and performs processing such as CDS (Correlated Double Sampling: processing to remove fixed pattern noise), signal amplification, or AD conversion for the signals.

The horizontal driving circuit 8 sequentially selects each of the column signal processing circuits 10 and guides the signals in the column signal processing circuit 10 to the horizontal signal line 5. The output circuit 6 processes and outputs the signals in the horizontal signal line 5. The signals may be only buffered, or may be subjected to processing such as black level adjustment, correction of variation between the columns, signal amplification, and color related processing prior to buffering.

The pixel 1a includes a single photodiode (PD) as a photoelectric conversion element and a plurality of MOS transistors.

Figure 3:
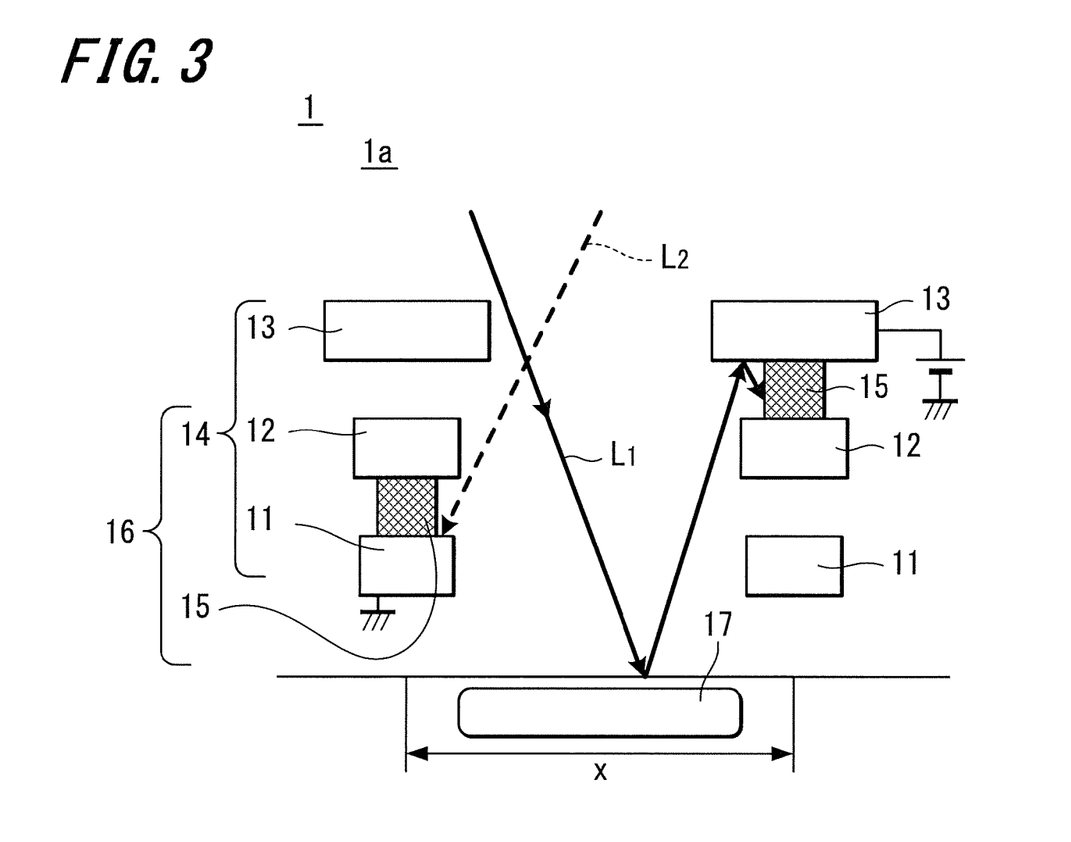
FIG. 3 is a view describing a peripheral wiring portion and an interlayer connecting material in a pixel in an example of a solid-state imaging device according to an embodiment of the present invention.

As shown in a schematic cross-sectional view of FIG. 3, the solid-state imaging device 1 according to the present embodiment includes a peripheral wiring portion 14 provided around at least part of a photoelectric converting portion 17 in the pixel 1a having the photoelectric converting portion 17 (cell size x). The peripheral wiring portion 14 includes a multilayer structure of a first wiring layer 11, a second wiring layer 12, and a third wiring layer 13. At least part of the peripheral wiring portion 14 has a light-shielding interlayer connecting material 15 provided to connect the layers 11 and 12 or the layers 12 and 13 of the multilayer structure. The peripheral wiring portion 14 having the interlayer connecting material 15 is formed in this manner as a light-shielding body 16 to suppress crosstalk due to the aforementioned modulation.

Specifically, the solid-state imaging device 1 according to the present embodiment includes the peripheral wiring portion 14 having the interlayer connecting material 15, that is, the light-shielding body 16. Accordingly, crosstalk from a pixel 1a to an adjacent pixel is reduced by suppressing crosstalk due to modulation on a substrate surface ($L_1$ in the figure) and suppressing crosstalk due to modulation in a wiring ($L_2$ in the figure).

The interlayer connecting material 15 is preferably formed of a material with excellent capability to be embedded such as tungsten (W). In the present embodiment, the term "light-shielding properties" may refer to reflection or absorption properties in at least part of a visible light region.

Figure 4:
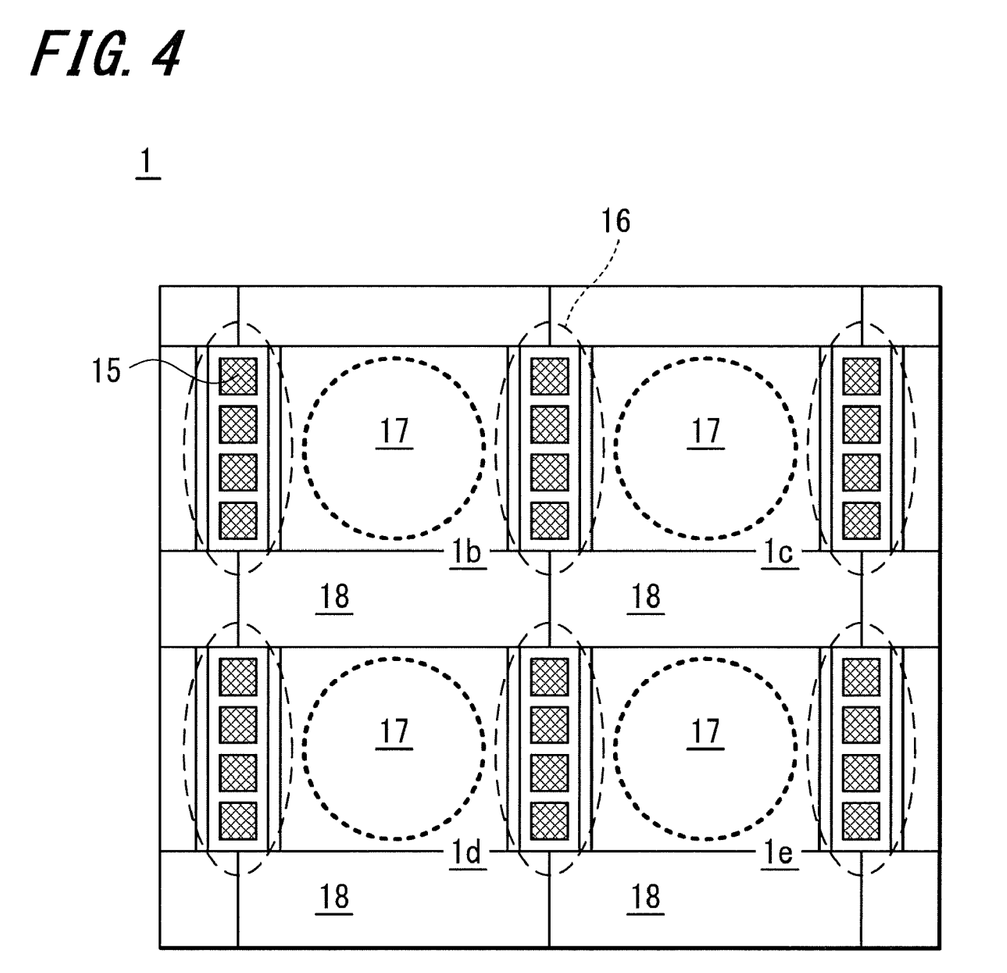
FIG. 4 is a view showing an example of a pixel circuit in a solid-state imaging device according to an embodiment of the present invention.

In the solid-state imaging device 1 according to the present embodiment, the peripheral wiring portion 14 having the interlayer connecting material 15, that is, the light-shielding body 16 may be preferably placed between the photoelectric converting portion 17 of the pixel 1a and at least a photoelectric converting portion 17 of an adjacent pixel. Specifically, as shown in FIG. 4, the light-shielding body 16 is provided between a photoelectric converting portion 17 of a pixel 1b and a photoelectric converting portion 17 of an adjacent pixel 1c directly adjacent to the pixel 1b without an amplifier circuit portion 18 having a plurality of transistors and the like provided in between. As a result, crosstalk between pixels may be suppressed which typically occurs in the related art.

Figure 5:
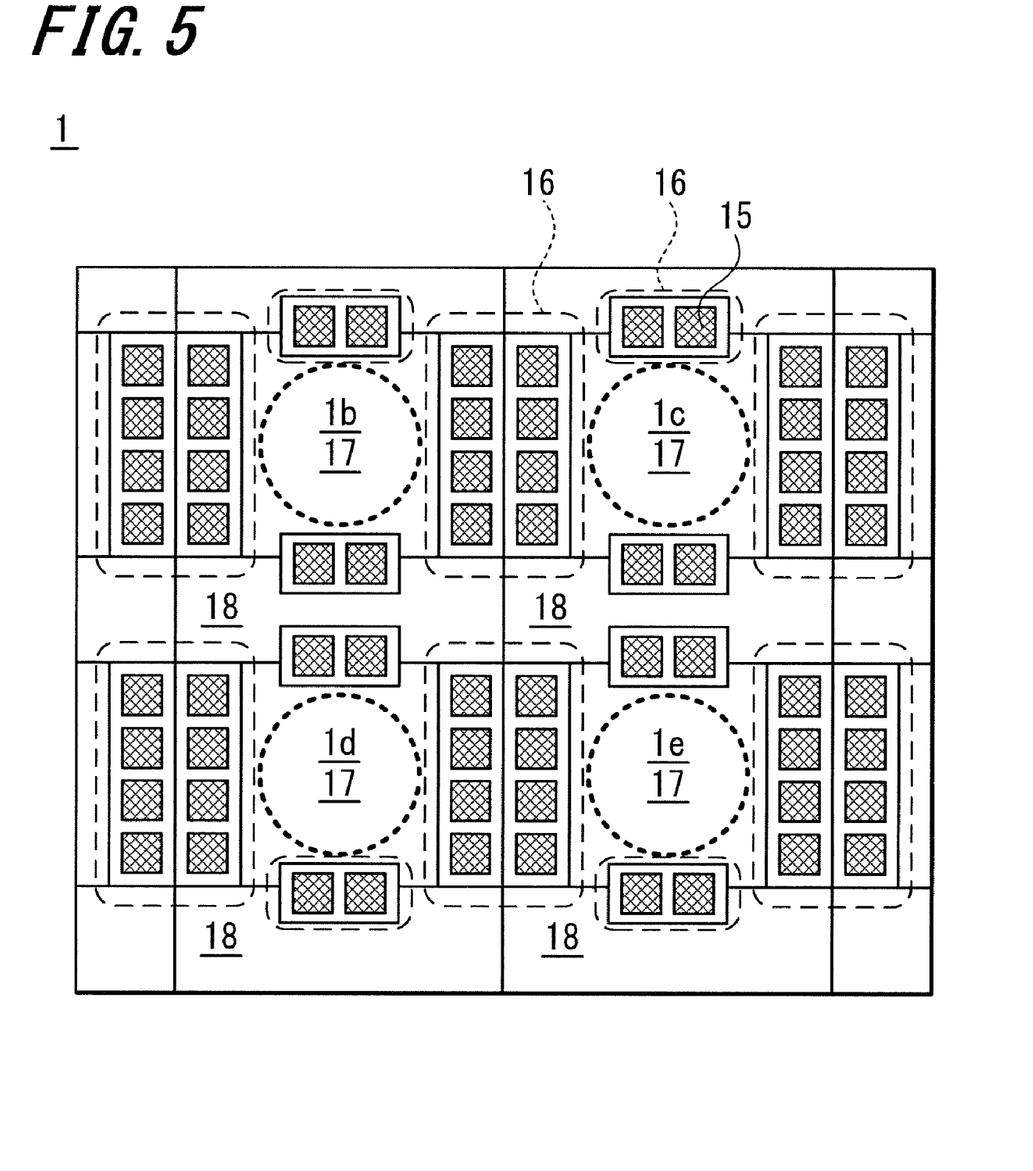
FIG. 5 is a view showing another example of a pixel circuit in a solid-state imaging device according to an embodiment of the present invention.

The peripheral wiring portion 14 having the interlayer connecting material 15, that is, the light-shielding body 16 may be more preferably placed in each of a plurality of places around the photoelectric converting portion 17 of the pixel 1a. Specifically, as shown in FIG. 5, the light-shielding body 16 is provided in a place between a pixel 1b and a pixel 1c (and a place between a pixel 1d and a pixel 1e) directly adjacent to each other without an amplifier circuit portion 18 in between. Further, the light-shielding body 16 may be more preferably provided in a place between the pixel 1b and the pixel 1d (and a place between the pixel 1c and the pixel 1e) relatively indirectly adjacent to each other through the amplifier circuit portion 18. Such a configuration may suppress crosstalk occurring through an amplifier circuit portion 18 in the related art, and crosstalk may be more considerably suppressed by providing the light-shielding body 16 in each of a plurality of places in each pixel to enable a light-shielding region to increase.

The peripheral wiring portion 14 having the interlayer connecting material 15 may include the amplifier circuit portion 18 to convert and transfer charges generated in the photoelectric converting portion 17. That is, each wiring of the peripheral wiring portion 14 forming the light-shielding body 16 may or may not be directly relevant to the amplifier circuit portion 18.

At least one of the peripheral wiring portion 14 and the interlayer connecting material 15 forming the light-shielding body 16 is preferably grounded to a specific potential. This is because the peripheral wiring part 14 or the interlayer connecting material 15 may have instable properties if not grounded, when a process that easily generates charges (such as plasma etching) is performed during manufacture.

Figure 6:
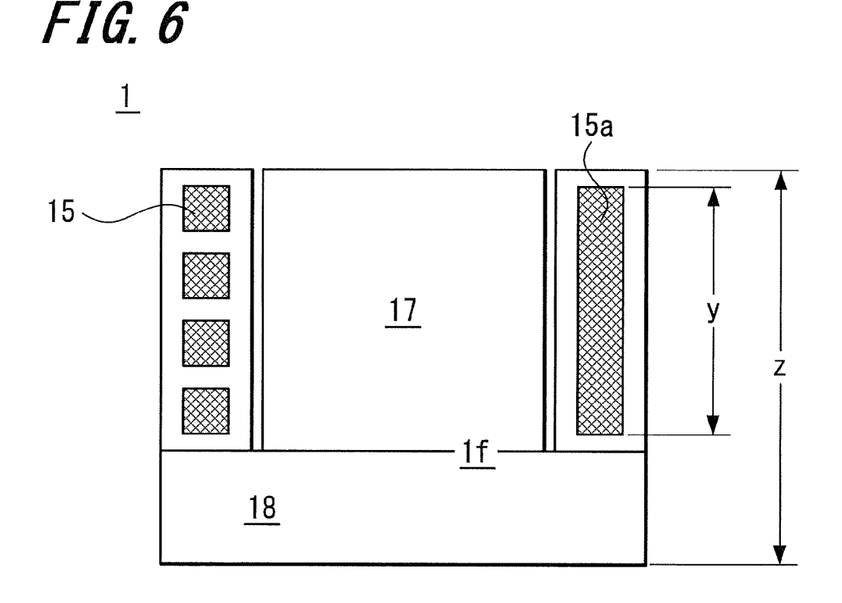
FIG. 6 is a view showing an example of a configuration of a peripheral wiring portion and an interlayer connecting material in a solid-state imaging device according to an embodiment of the present invention.

As shown in FIG. 6, the interlayer connecting material 15 is preferably linearly arranged for a two-dimensional matrix having a number of pixels if arranged. Specific examples of such linear arrangement may include linear arrangement of a plurality (a pair) of the interlayer connecting materials 15 and an interlayer connecting material 15a having a linear shape.

A length (y in the figure) of the linearly arranged interlayer connecting materials 15 (or the interlayer connecting material 15a having a linear shape) is preferably smaller than a length (z in the figure) of a pixel if having a polygonal shape (a quadrangular shape in the present embodiment) or a length of a longest diagonal of the polygonal shape. This is because the interlayer connecting material 15 may be preferably placed in each pixel (picture cell) in order to improve optical symmetry of a number of pixels in the solid-state imaging device.

Here, a circuit configuration which may be used for the pixel 1a will be described.

Figure 7:
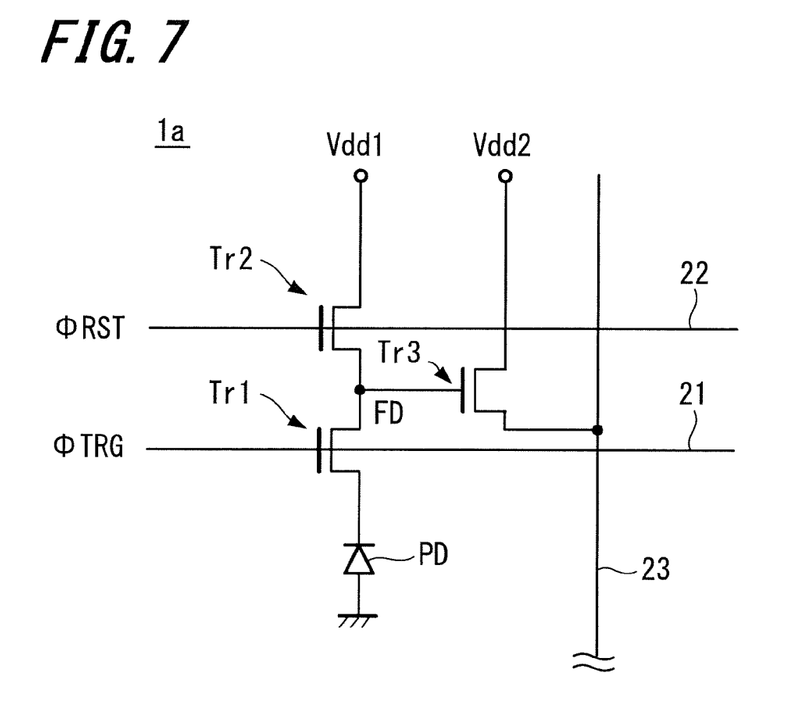
FIG. 7 is a view showing another example of a configuration of a peripheral wiring portion and an interlayer connecting material in a solid-state imaging device according to an embodiment of the present invention.

First, the pixel 1a may be configured to have a three-transistor circuit shown in FIG. 7, for example.

In this circuit configuration, a cathode (n-region) of a photodiode (PD) is connected to a gate of an amplifying transistor Tr3 through a transfer transistor Tr1. A node electrically linked to the gate of the amplifying transistor Tr3 is called a floating diffusion (FD). The transfer transistor Tr1 is connected between the photodiode (PD) and the floating diffusion (FD); is turned on by supplying a transfer pulse φTRG to a gate of the transfer transistor Tr1 through a transfer line 21; and transfers signal charges photoelectrically converted in the photodiode (PD) to the floating diffusion (FD).

A reset transistor Tr2 has a drain connected to a pixel power supply Vdd1 and a source connected to the floating diffusion (FD). The reset transistor Tr2 is turned on by supplying a reset pulse φRST to a gate of the reset transistor Tr2 through a reset line 22. Then, the reset transistor Tr2 discharges charges in the floating diffusion (FD) to the pixel power supply Vdd1 to reset the floating diffusion (FD) prior to transfer of the signal charges to the floating diffusion (FD) from the photodiode (PD).

The amplifying transistor Tr3 has a gate connected to the floating diffusion (FD), a drain connected to a pixel power supply Vdd2, and a source connected to a vertical signal line 23. The amplifying transistor Tr3 outputs a potential of the floating diffusion (FD) after being reset by the reset transistor Tr2 to the vertical signal line as a reset level. Further, the amplifying transistor Tr3 outputs a potential of the floating diffusion (FD) after the transfer transistor Tr1 transfers the signal charges to the vertical signal line 23 as a signal level.

The pixel power supply Vdd1 is switched between a high level and a low level by driving the pixel, so that the drain of the amplifying transistor Tr3 fluctuates.

Figure 8:
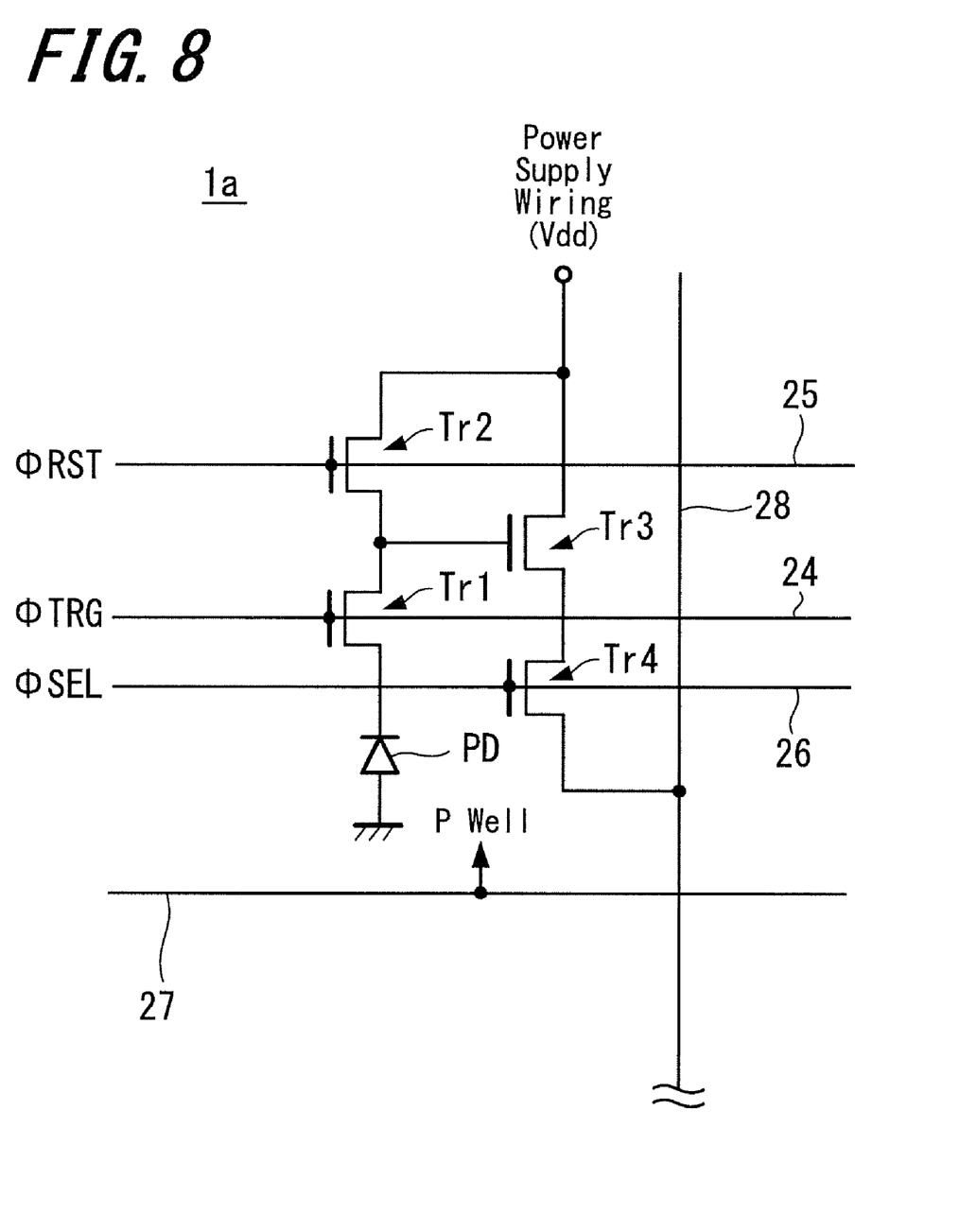
FIG. 8 is a view describing a peripheral wiring portion and an interlayer connecting material in a solid-state imaging device according to an embodiment of the present invention.

Alternatively, the pixel 1a may be configured to have a four-transistor circuit shown in FIG. 8, for example.

This circuit configuration has four transistors Tr1 to Tr4 in addition to a photoelectric conversion element, for example a photodiode (PD). Here, the transistors Tr1 to Tr4 are formed as N-channel MOS transistors, for example.

The photodiode (PD) photoelectrically converts received light into an amount of optical charges (electrons in this case) corresponding to intensity of the light. A cathode (n-type region) of the photodiode (PD) is connected to a gate of the amplifying transistor Tr3 through the transfer transistor Tr1. A node electrically linked to the gate of the amplifying transistor Tr3 forms a floating diffusion (FD).

Wirings in a transverse direction, specifically, a transfer line 24, a reset line 25, and a selection line 26 are common for the pixels in the same row and controlled by a vertical driving circuit 7. However, a well wiring 27 to fix a p-well potential of the pixel 1a is fixed to a ground potential.

In this configuration, the transfer transistor Tr1 is connected between the cathode of the photodiode (PD) and the floating diffusion (FD); is turned on by supplying a transfer pulse φTRG to a gate of the transfer transistor Tr1 through the transfer line 24; and transfers the optical charges photoelectrically converted in the photodiode (PD) to the floating diffusion (FD).

The reset transistor Tr2 has a drain connected to a pixel power supply Vdd and a source connected to the floating diffusion (FD) and is turned on by supplying a reset pulse φRST to a gate of the reset transistor Tr2 through the reset line 25. Further, the reset transistor Tr2 discharges charges in the floating diffusion (FD) to the pixel power supply Vdd to reset the floating diffusion (FD) prior to transfer of the signal charges to the floating diffusion (FD) from the photodiode (PD).

The amplifying transistor Tr3 has a gate connected to the floating diffusion (FD) and a drain connected to the pixel power supply Vdd and outputs a potential of the floating diffusion (FD) after being reset by the reset transistor Tr2 as a reset level. Further, the amplifying Transistor Tr3 outputs a potential of the floating diffusion (FD) after the transfer transistor Tr1 transfers the signal charges as a signal level.

The selection transistor Tr4 has a drain connected to a source of the amplifying transistor Tr3 and a source connected to a vertical signal line 28, for example. The selection transistor Tr4 is turned on by supplying a selection pulse φSEL to a gate of the selection transistor Tr4 through the selection line 26 and relays a signal output from the amplifying transistor Tr3 to the vertical signal line 28, with the pixel 1a in a selected state.

The solid-state imaging device 1 of the present embodiment may include either such a three-transistor circuit or such a four-transistor circuit.

EXAMPLE

An example of the present embodiment will be described.

In the present example, there will be described results of examination based on simulation for the solid-state imaging device of the present embodiment.

The solid-state imaging device according to the present embodiment is examined using a simulator. As a result, it may be confirmed that crosstalk caused by light reflected on a semiconductor substrate surface and the reflected light further reflected on a rear surface of an uppermost metal wiring is considerably reduced.

It may also be confirmed that, in a CMOS image sensor having a peripheral wiring portion with a wiring structure of three layers, for example, crosstalk caused by the following component is improved by 10% to 30%, although the value of improvement in such crosstalk varies according to a configuration of the multilayer wiring structure. Specifically, such component as reflected mainly by a rear surface of an uppermost metal wiring layer and then reflected zero to several times and mixed in an adjacent pixel is improved.

As described in the aforementioned embodiment and example, the solid-state imaging device according to the present embodiment includes an interlayer connecting material functioning as a wall to prevent mixing of light. Therefore, the solid-state imaging device may improve image quality with a reduced crosstalk.

An electronic device formed of the solid-state imaging device includes the solid-state imaging device that may improve image quality with a reduced crosstalk. Therefore, the electronic device may use high-quality image data.

In particular, a solid-state imaging device having pixels reduced in size in response to a request to reduce the device in weight and size can improve its properties. Specifically, in a solid-state imaging device having a width for separation between pixels being optically insufficient or a solid-state imaging device having a large area occupied by wirings, the solid-state imaging device configured according to an embodiment of the present invention may provide improved properties as compared with such a solid-state imaging device of the related art. This is because a solid-state imaging device according to an embodiment of the present invention may considerably suppress crosstalk due to mixing of light in adjacent pixels caused by repeated reflection or the like. Such mixing of light occurs easily in a solid-state imaging device having pixels reduced in size in accordance with the progress in microfabrication technology and the like than in a solid-state imaging device having a large pixel size.

A solid-state imaging device according to an embodiment of the present invention suppresses diffused light, scattered light, and reflected light caused by a semiconductor substrate, a wiring, an interlayer film, and the like. Therefore, it is possible to prevent deterioration of sensitivity and a reduction in optical opening area, because original light incident on a photoelectric converting portion is not shielded.

In manufacture of a solid-state imaging device according to an embodiment of the present invention, crosstalk may be reduced by selecting a mode (a pattern such as a formation position and a shape) when forming an interlayer connecting material to connect wirings of a multilayer structure to each other without a need to perform a particular additional process. Accordingly, there may be no need to increase the number of processes, so that a cost and a manufacturing tact time may also be reduced. Further, it is not necessary to determine (design and set) new conditions for a wafer process, so that it is possible to rapidly start manufacturing the solid-state imaging device in manufacturing sites after completion of basic design of the light-shielding body.

Materials used and numerical conditions such as amounts of the materials, treatment time, and dimensions referred to in the description of the aforementioned embodiment are only suitable examples, and dimensions, shapes and configurations in the figures used for the description are only schematic conditions. That is, embodiments of the present invention are not limited to this embodiment.

For example, the aforementioned embodiment is described referring to, as an example, a case where a peripheral wiring portion having an interlayer connecting material (light-shielding body) is provided in each pixel of a solid-state imaging device. However, the light-shielding body may not be placed in this manner. Specifically, it is not necessary to provide a certain number of interlayer connecting materials or light-shielding bodies in each pixel, and it is possible to provide interlayer connecting materials or light-shielding bodies on two sides of each of some quadrangular pixels and on four sides of each of the other quadrangular pixels, for example. It is also possible to provide an interlayer connecting material or light-shielding body surrounding one unit of a plurality of pixels. It is also possible to provide an interlayer connecting material or light-shielding body only in a place where pixels represent different colors (such as red, green, and blue) among a plurality of pixels.

The aforementioned embodiment is described for an example of a solid-state imaging device having a number of pixels arranged in a two-dimensional matrix. However, it should be appreciated that the embodiment may be applied to a linear sensor having a number of pixels one-dimensionally arranged. If the embodiment is applied to a linear sensor, properties in a light-dark boundary may be improved in particular.

In the aforementioned embodiment, the term "light-shielding properties" may refer to reflection or absorption properties in at least part of a visible light region, for example; however, the term may also refer to ultraviolet light reflection or absorption properties.

The aforementioned embodiment is described for a CMOS solid-state imaging device; however, a solid-state imaging device according to an embodiment of the present invention may form a CCD solid-state imaging device.

A solid-state imaging device according to an embodiment of the present invention may be an element formed as one chip, an element formed by a plurality of chips, or an element formed as a module, for example. Various modifications and alterations of the present invention are possible.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device including a number of pixels arranged one-dimensionally or in a two-dimensional matrix with each pixel having a photoelectric converting portion, said device comprising:

a peripheral wiring portion with a multilayer wiring structure around at least part of the photoelectric converting portion in each of the pixels; and a light-shielding interlayer connecting material connecting layers of the multilayer structure to each other and on at least part of the peripheral wiring portion, wherein, the light-shield interlayer connecting material is capable of reflecting or absorbing visible light wherein crosstalk due to modulation on a substrate surface on which the pixels are arranged is suppressed and crosstalk due to modulation in the multilayer wiring structure is suppressed.

2. A solid-state imaging device according to claim 1, wherein
the peripheral wiring portion is between the photoelectric converting portions of adjacent pixels.

3. A solid-state imaging device according to claim 1, wherein
the peripheral wiring portion is provided in each of a plurality of places around the photoelectric converting portion.

4. A solid-state imaging device according to claim 1, wherein
a plurality of the interlayer connecting materials are provided on the peripheral wiring portion.

5. A solid-state imaging device according to claim 1, wherein
the peripheral wiring portion includes an amplifier circuit portion to convert and transfer charges generated in the photoelectric converting portion.

6. A solid-state imaging device according to claim 1, wherein
at least one of the interlayer connecting material and the peripheral wiring portion is grounded to a specific potential.

7. A solid-state imaging device according to claim 1, wherein
the interlayer connecting material is linearly provided the two-dimensional matrix.

8. A solid-state imaging device according to claim 1, wherein
the pixels are arranged in a two-dimensional matrix, each of the pixels has a polygonal shape, and
a length of the interlayer connecting material is smaller than a length of a longest side of the polygonal shape.

9. A solid-state imaging device according to claim 1, wherein
the pixels are arranged in a two-dimensional matrix, each of the pixels are has a polygonal shape, and
a length of the interlayer connecting material is smaller than a length of a longest diagonal of the polygonal shape.

10. An electronic device including a solid-state imaging device, the solid-state imaging device having a number of pixels arranged one-dimensionally or in a two-dimensional matrix, and each pixel including a photoelectric converting portion,
wherein, the solid-state imaging device comprises:
(a) a peripheral wiring portion with a multilayer wiring structure provided around at least part of the photoelectric converting portion in each of the; and
(b) light-shielding interlayer connecting material connecting layers of the multilayer structure to each other and on at least part of the peripheral wiring portion, the interlayer connecting material capable of reflecting or absorbing visible light wherein crosstalk due to modulation on a substrate surface on which the pixels are arranged is suppressed and crosstalk due to modulation in the multilayer wiring structure is suppressed.

* * * * *